United States Patent [19]

Kalbskopf et al.

[11] 4,351,267
[45] Sep. 28, 1982

[54] APPARATUS FOR CONTINUOUSLY DEPOSITING A LAYER OF A SOLID MATERIAL ON THE SURFACE OF A SUBSTRATE HEATED TO A HIGH TEMPERATURE

[75] Inventors: Reinhard Kalbskopf, Onex; Otto Baumberger, Carouge, both of Switzerland

[73] Assignee: Societe Italiana Vetro-Siv-S.p.A., San Salvo, Italy

[21] Appl. No.: 236,134

[22] Filed: Feb. 18, 1981

Related U.S. Application Data

[62] Division of Ser. No. 117,086, Jan. 31, 1980, Pat. No. 4,294,868.

[30] Foreign Application Priority Data

Feb. 14, 1979 [CH] Switzerland .......................... 1412/79

[51] Int. Cl.³ .......................... B05B 7/00; C23C 13/10
[52] U.S. Cl. .................................. 118/718; 118/729; 118/61; 239/422
[58] Field of Search ............... 118/715, 718, 719, 729, 118/65, 68, 61; 427/255.1, 255.2, 255.5, 426, 109, 163, 166, 255; 34/47, 160; 239/422; 65/60.5, 6.51, 60.52

[56] References Cited

U.S. PATENT DOCUMENTS

| | | | |
|---|---|---|---|
| 3,689,304 | 9/1972 | Bamford | 118/718 X |
| 3,814,327 | 6/1974 | Dada | 239/422 X |
| 3,951,100 | 4/1976 | Sopko et al. | 118/729 |

FOREIGN PATENT DOCUMENTS

| | | | |
|---|---|---|---|
| 2123274 | 11/1972 | Fed. Rep. of Germany | 118/715 |
| 2326440 | 12/1974 | Fed. Rep. of Germany | 239/422 |
| 109033 | 10/1974 | German Democratic Rep. | |
| 53-20951 | 6/1978 | Japan | 427/255.5 |
| 1516032 | 6/1978 | United Kingdom | |

Primary Examiner—John D. Smith
Assistant Examiner—Bernard F. Plantz
Attorney, Agent, or Firm—Finnegan, Henderson, Farabow, Garrett & Dunner

[57] ABSTRACT

By means of the nozzle, three gaseous curtains are formed converging on the surface of the substrate heated to a temperature of about 600° C. which is driven in translatory movement, the intermediate curtain being constituted by a gaseous reactant or a reactant diluted in a carrier gas and the two lateral curtains being constituted by another naturally gaseous reactant or reactant diluted in a gas. The gaseous products of the reaction issuing from the nozzle are compelled to flow above a predetermined region of the substrate and these products are evacuated by suction by means of channels disposed at the extremities of this region of the substrate and a pump to which the channels are connected.

6 Claims, 4 Drawing Figures

APPARATUS FOR CONTINUOUSLY DEPOSITING A LAYER OF A SOLID MATERIAL ON THE SURFACE OF A SUBSTRATE HEATED TO A HIGH TEMPERATURE

This is division of application Ser. No. 117,086, filed Jan. 31, 1980 now U.S. Pat. No. 4,294,868.

Various processes and devices have already been proposed for coating a substrate, for example a glass plate, with a layer of a semiconductor material, for example tin oxide, which layer must at the same time have a transparency rather similar to that of the substrate, a relatively low electrical resistance and a high mechanical strength.

Thus, among other processes, it has been attempted in particular to make use for this purpose of the method known under the English designation Chemical Vapor Deposition or C.V.D. More particularly, from the paper by H. Koch entitled: "Elektrische Untersuchungen an Zinndioxydschichten" ("Electrical Investigations on Stannic Oxide Layers") (see Phys. Stat. 1963, Vol. 3, pages 1059 and following) a process and a device are known for depositing a thin layer of $SnO_2$ on a glass plate by reacting $SnCl_4$ and $H_2O$ supplied in diluted form in a carrier gas, in this case air, and brought in mutual contact with the surface of the glass plate previously heated to a temperature of the order of 200° to 400° C. These two gaseous reactants are projected on the glass by means of a nozzle with two coaxial jet ducts, the central duct of which carries the gaseous dilution of $SnO_2$, whilst the outer duct is fed with the gaseous dilution of $H_2O$.

A process and an apparatus very similar to the foregoing have also been proposed, in particular in German patent application No. 2,123,274, published prior to examination, which in addition makes possible doping with antimony of the $SnO_2$-layer deposited on a substrate, in this case also a glass plate, in order to reduce the electrical resistivity of this layer. To this end, there was employed in addition $SbCl_3$ in dilution in a carrier gas, in this case nitrogen, which was brought into contact with $SnCl_4$ and $H_2O$ above the substrate, by means of a nozzle with three coaxial jet ducts each receiving one of the above components. The combining reaction is thus effected in proximity to the substrate and at a certain distance from the three jet ducts of the nozzle.

In both of the above-cited cases, the processes and devices concerned are designed solely for coating with a doped or undoped $SnO_2$-layer platelets of relatively small dimensions on which this coating is effected by relative longitudinal displacement of the nozzle and the platelets. The deposit obtained therefore has the form of a stannic oxide strip of rather uneven transparency over the length of this strip. In fact, the mixture of the reactants emerging from a nozzle of the type described is not perfectly homogenous, so that the deposit obtained has regions of differing thickness and composition in the form of streaks extending parallel to the axis of relative movement executed by the nozzle and the substrate.

It is opportune to note here that, even if the processes and devices described above are acceptable where it is a matter of coating substrates of relatively small dimensions, they prove to be practically unusable where a large-scale industrial operation is concerned, related to the coating of particularly large substrates, as is for example the case of practically endless strips of glass, which may have a width of several meters, such as those obtained by the so-called "float" process.

Indeed, if it were intended to employ for such an application the aforecited processes and devices, it would be necessary either to dispose side by side, over the entire width of the glass strip, a plurality of the nozzles of the type described, and it is easy to imagine the complexity of the installation which would be involved, or to employ only a limited number of nozzles which a mechanism would have to drive above the strip in a very rapid alternating movement transverse to the axis of movement of the strip to ensure the coating of the whole of the strip surface. It is obvious that neither of these solutions would allow to obtain a $SnO_2$—coating sufficiently homogenous to offer at the same time low electrical conductivity, the transparency and the general high-quality aspect desired in the finished product. If, for example, the latter is a glass intended for use either in the manufacture of windows or doors of buildings or of windows or windscreens of vehicles of all kinds, it is easily understood that such qualitites are highly desirable.

To these should be added further the ability of the desired $SnO_2$ layers of not impeding the mechanical or thermal treatment to which the glass sheets are usually subjected. In particular, it is necessary that such sheets of glass, coated with doped or undoped $SnO_2$, may be cut with diamond by acting on one face or the other, without impairing the qualities of the $SnO_2$-layer. Similarly, it would be necessary to have the facility of subjecting the glass sheets obtained by cutting to a tempering operation, without mechanical or optical deterioration of its coating. Lastly, it would be desirable to be able to effect the warm bending of such sheets, especially in the manufacture of windscreens or rear windows of cars, for example, again without modifying the previously mentioned qualities of low electrical resistivity, good mechanical properties, good transparency and a light reflection as homogenous as possible over the entire area of the sheets.

The totality of these requirements cannot be satisfied by using the processes or devices of the described type, that is to say, those which allow to treat individually only a very small glass surface.

It is probable that concerns of the aforecited nature have led to the replacement of the processes and devices described by those processes and devices which are in particular the subject matter of U.S. Pat. Nos. 3,850,679 and 3,888,649, and of British Pat. No. 1,507,996.

In these publications as a whole, there is employed generally a device for distributing the previously prepared reactive gases in which these gases are directed at the surface of the glass sheet simultaneously over the entire width of this sheet, in the form of two successive curtains as in the first two Patents, and in the form of a gas stream oriented tangentially to the glass over a preset length of the sheet, in the third Patent.

However, these devices cannot be suitable for the application of the C.V.D. processes mentioned previously, designed for the deposition of doped or undoped $SnO_2$-layers, because the arrival of a gaseous mixture of $SnCl_4$ and $H_2O$ in proximity of the distributor orifice of these devices would lead to a premature and violent reaction of these components, taking into account the relatively high temperature, practically the same as that of the glass to be coated (of the order of 400° C.), of the walls of the devices defining this orifice. Owing to this, two additional drawbacks would result, namely, on one hand, a more or less extensive clogging of the exhaust orifice of the distributor devices and, on the other hand, the formation on the glass of a particularly inhomogenous SnO2-deposit, with the attendant greatly differing electrical, mechanical or physical properties.

The purpose of the present invention is precisely to provide an apparatus for continuously depositing on the surface of a substrate heated to a high temperature a layer of a solid material resulting from the reaction of at least two gaseous reactants or reactants diluted in a gas, which make it possible to avoid all the drawbacks and defects mentioned above.

The process carried out by this apparatus is characterised in that the said streams have the form of rectilinear gas curtains, the transverse profile of each converting toward an imaginary edge common to all streams, that these curtains and/or the substrate are disposed in such a manner that said edge is contained substantially in the plane of the said surface of the substrate, that the gases evolving from the reaction which results from the impact of said streams on the substrate are compelled to flow above a predetermined portion of this substrate extending on either side of said edge and, lastly, that these gases are evacuated at the extremity of said substrate portion located opposite the said imaginary common edge of said curtains.

In a particular mode of execution of this process, the gaseous curtains are three in number in tangential contact by pairs, the central curtain being formed by the stream of the first reactant and the two lateral curtains by the stream of the other reactant.

When this process is applied to deposit on a substrate, in particular a sheet of glass heated to high temperature, of the order of 600° C. for example, a layer of SnO2 by reaction of liquid SnCl4 and H2O-vapour diluted in an inert carrier gas, such as nitrogen, the central gaseous curtain will be constituted by the gaseous dilution of SnCl4, the two lateral curtains being formed by the dilution of water vapour. The subject of the present invention is the apparatus for carrying out the described process and it comprises a source for a first gaseous reactant or reactant diluted in a carrier gas, a source for a second gaseous reactant or reactant diluted in a carrier gas, a nozzle with three jet ducts each having an aperture constituted by a rectilinear slot and in which the lateral walls delimiting the longitudinal edges of each slot converge toward a line common to all jet ducts, a first among these jet ducts adjoining, with a first longitudinal edge of its exhaust aperture, a longitudinal exhaust aperture edge of a second jet duct and, with the second longitudinal edge of said aperture, a longitudinal edge of the exhaust aperture of the third jet duct, a first and second deflecting surfaces, extending over a predetermined length to each side of said jet ducts from the second longitudinal edge of the exhaust aperture of the second and third jet duct respectively, said deflecting surfaces being co-planar with each other and with the longitudinal edges of the jet duct apertures of the nozzle and being kinematically integral with this nozzle, a first distributor network connecting the source of the first reactant with the first jet duct of the nozzle, a second distributor network connecting the source of the second reactant with the second and third jet duct of the nozzle, means for setting in relative movement the substrate and the nozzle in a direction substantially perpendicular to said imaginary line, means for maintaining constant in the course of said relative movement the distance separating the plane containing said jet duct apertures of the nozzle and said deflecting surfaces from the said surface of the substrate, this distance being substantially equal to that comprised between the jet ducts of the nozzle and the said imaginary line, at least one device for evacuating the reaction gases evolving in the space comprised between said deflecting surfaces and the surface of the substrate, from the extremities of this space most remote from the apertures of said nozzles.

As will be seen in the following, the above process and installation make it effectively possible to carry out the coating, at a very high speed, of sheet or plate glass, with an SnO2-layer of excellent homogeneity, guaranteeing very high performance levels with respect of mechanical qualities and of electrical and optical properties of all kinds.

BRIEF DESCRIPTION OF THE FIGURES

The attached drawing shows, by way of example and very schematically, a form of embodiment of the installation being the subject of the present invention:

FIG. 1 is a general view.

Figures 1, 2:
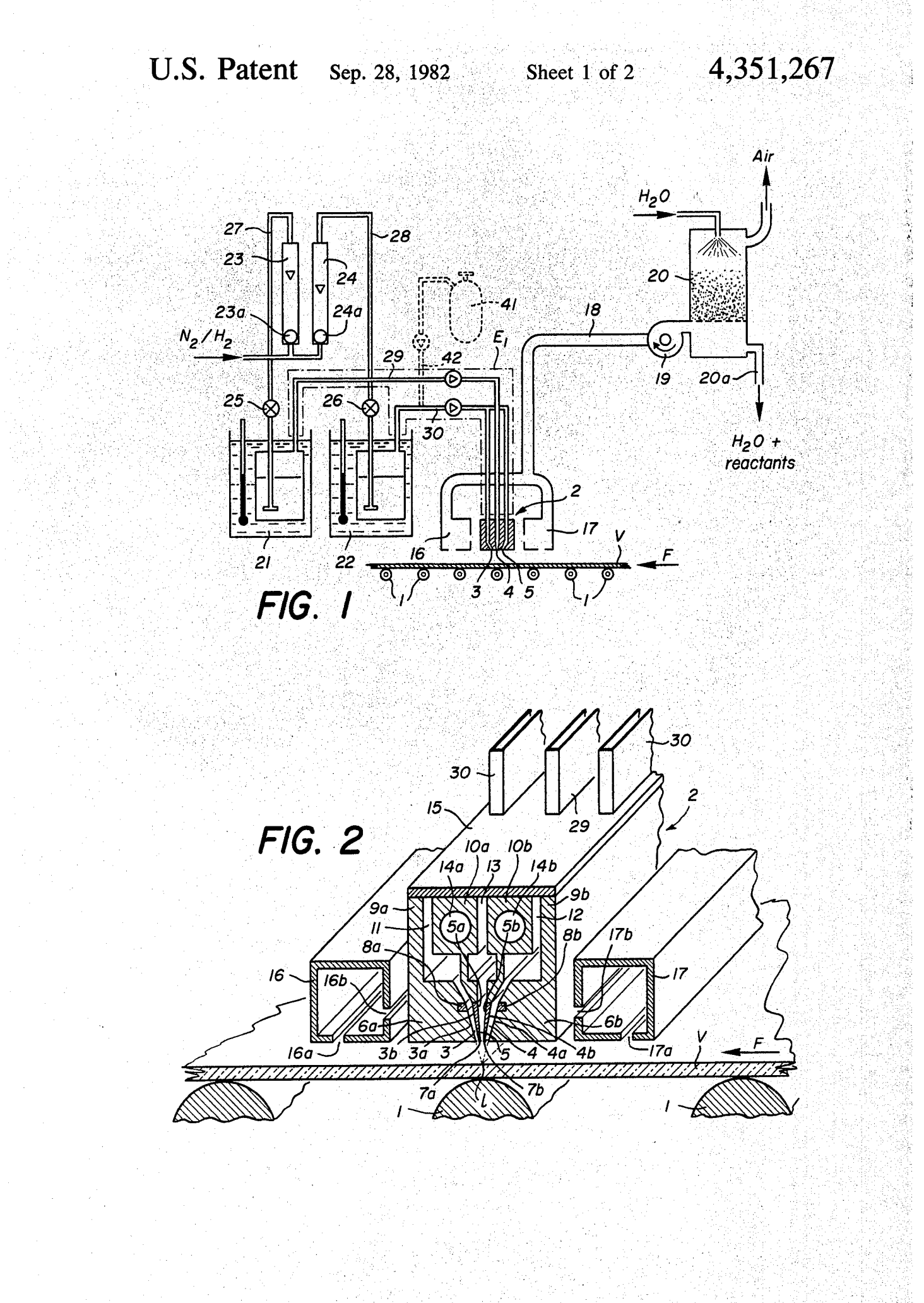

FIG. 2 is a partial perspective view, in vertical section on an enlarged scale, of an element of the installation in FIG. 1.

DETAILED DESCRIPTION OF THE FIGURES

Figure 1A:
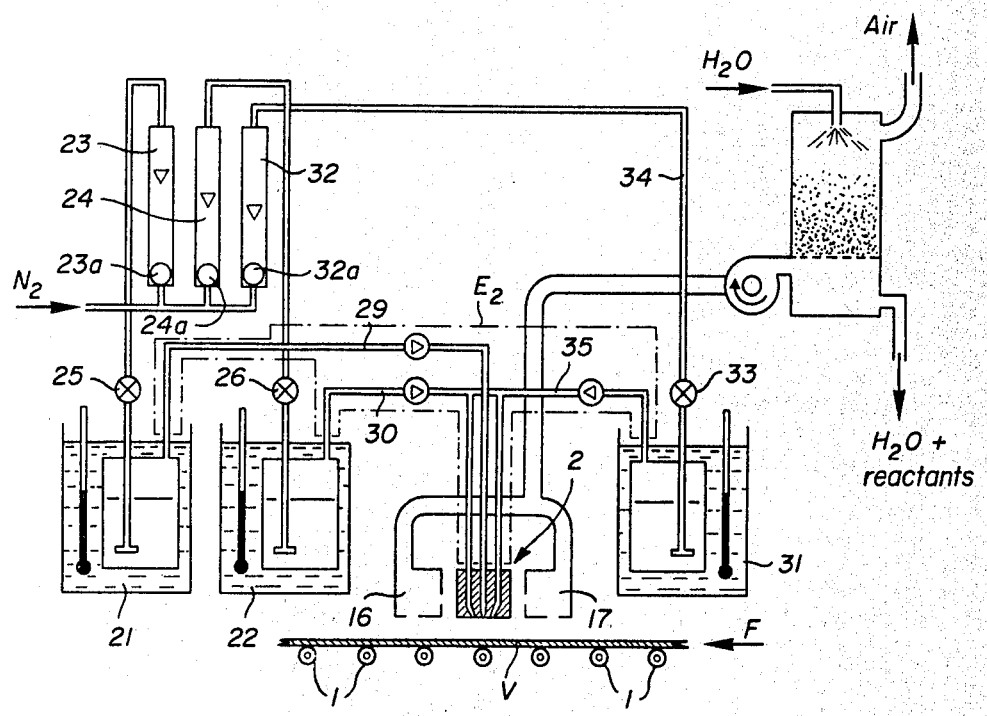
FIGS. 1a and 1b are views similar to that of FIG. 1, in accordance with modified forms of embodiment.

The installation shown in the drawing is designed to deposit by the so-called C.V.D.-method on a substrate, in this case a sheet of glass V heated to high temperature, a layer of stannic oxide SnO2, by exploiting the following chemical reaction:

$$SnCl_4 + 2H_2O \rightarrow SnO_2 + 4HCl \nearrow$$

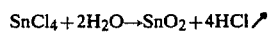

To this end, the installation comprises first of all a train of rollers 1 on which the sheet V rests and moves in direction F, which rollers are driven in anti-clockwise rotation by an electric motor (not shown) and which have, of course, a length compatible with the width of the sheet of glass to be carried. The speed of rotation of the rollers 1 will be so selected that the displacement of the sheet V is effected with a linear speed of some meters per minute, of the order of 1 to 10, according to each case.

Above this train of rollers 1, the installation shown has a nozzle 2, the basic structural profile of which is the subject of FIG. 2, to which reference will be made from now on. This nozzle comprises in fact three separate jet ducts 3, 4 and 5, respectively, extending longitudinally in a direction parallel to the already mentioned rollers 1, over a length corresponding to the width of the glass sheet V. Thus, such jet ducts could have a length of several meters. As can be seen in the drawing, the jet ducts 3 to 5 are formed by assembly of elongated sectional shapes 6a and 6b, 7a and 7b, 8a and 8b, which are in turn fastened, by any suitable means, to two pairs of profiled elements 9a and 9b, 10a and 10b, respectively, delimiting between each other ducts 11, 12 and 13 communicating with the jet ducts 3, 4 and 5, respectively.

The lateral walls 3a and 3b, 4a and 4b, 5a and 5b of the jet ducts 3 to 5 converge toward a common line l located at a distance from the plane containing the inner face of the sections 6a and 6b of the order of 3 to 6 mm, for example. Furthermore, the exhaust apertures of the blast pipes 3, 4 and 5, which are in the shape of three oblong slots extending over the entire length of the sections 6a, 7a, 7b and 6b, have a width of some tenths of a millimeter, for example 1/10 or 2/10.

The width of the lower face of sections 6a and 6b will be preferably comprised between 10 and 20 times the total width of the exhaust slots of jet ducts 3 to 5.

Preferably, but not exclusively, this lower face of sections 6a and 6b will be covered with a layer of a chemically inert metal or an alloy of such metals or again of metal oxide. By way of example, the metal could be gold or platinum. The oxides could be selected among $SnO_2$, $SiO_2$ or $Al_2O_3$.

In fact, the usual metals and alloys, such as steel or brass have, in the presence of hydrogen, catalytic properties which could perturb the control of the desired reaction to obtain a deposit of $SnO_2$ having the desired mechanical, physical and optical qualities. The reason for the presence of hydrogen will be explained in the following.

It is of course understood that the assembly of the sections constituting the nozzle 2 is covered, at each extremity, by a cover plate, not shown, mounted so as to ensure total fluid-tightness and to form in this manner the jet ducts 3, 4 and 5 and the ducts 11, 12 and 13 which are to be well sealed laterally. The channels 14a and 14b formed in the upper part of sections 10a and 10b, over the entire length of the latter, make it possible to establish a circulation of a fluid, for example oil, intended to maintain the nozzle 2 at an optimum operating temperature.

Another plate 15 covers the upper face of nozzle 2 over its whole area and in a fluid-tight manner, thus preventing any communication between the ducts 11, 12 and 13.

It will be noted further that the general profile and the surface quality of the walls delimiting not only the jet ducts 3 to 5 but also the ducts 11 to 13 as well as the transverse sections of the latter are such, that for gas flow rates of the order of 3 to 6 l/h per centimeter of nozzle length the flow at the outlet of the nozzles will be of "laminar" type.

To either side of the nozzle 2, and over the entire length of the latter, the installation shown comprises two suction channels 16 and 17 (FIGS. 1 and 2), of straight square section and the lower face of which is coplanar with the lower face of the sections 6a and 6b previously described. These channels each have two longitudinal slits, 16a and 16b for channel 16, 17a and 17b for channel 17, respectively. These channels are connected, by a conduit system 18, to the intake of a suction pump 19 connected, with its outlet, to the bottom of a scrubbing tower 20 filled with refractory materials (Raschig rings).

In addition, the installation shown comprises two thermostat-controlled bubble tanks 21 and 22, the first containing liquid stannic chloride, $SnCl_4$, and the other water, two flowmeters 23 and 24 having a flow-regulating valve, 23a and 24a, fed with a mixture of nitrogen and hydrogen in 60/40 ratio, two valves 25 and 26 fitted on the pipes 27 and 28 connecting the flowmeters to the bubble tanks mentioned above. Two conduits 29 and 30 connect the outlet of the vessels 21 and 22 respectively to the duct 13 and to the ducts 11 and 12 of the nozzle 2, that is to say, in fact to the jet duct 5 of this nozzle, for the conduit 29, and to the jet ducts 3 and 4, for the conduit 30.

The conduits 29 and 30 pass through an enclosure $E_1$, illustrated schematically by a contour drawn in composite lines, containing a heating liquid, for example oil, maintained at a constant temperature of about 110° C. by any suitable means.

The installation described in the foregoing makes it possible to coat, for example, a glass plate with a layer of stannic oxide having a thickness of the order of 500 nm, having at the same time a very good transparency, a relatively low electrical conductivity and a high mechanical strength and resistance to acids.

An experimental installation of this type, fitted with a 20 cm long nozzle in which the aperture of the jet ducts 3, 4 and 5 had a width of 0.1–0.1 and 0.2 mm, allowed to treat a glass plate of 20 cm width and 4 mm thickness heated to about 600° C. and driven in the direction F (FIGS. 1 and 2) with a velocity of 2 m/min. The distance separating the lower face of the nozzle and the surface of the glass was 6 mm.

The vessels 21 and 22 employed had respective capacities of 200 ml for liquid $SnCl_4$ and 300 ml for $H_2O$. These vessels were heated to such temperatures that, for a carrier gas flow rate of 60 l/h $N_2/H_2$ for vessel 21 and 120 l/h for vessel 22, the flow rates being controlled by operation of valves 23a and 24a, there was obtained a flow rate of reactant diluted in this gas of 2 mol/h stannic chloride, $SnCl_4$, and 1 mol/h $H_2O$. In addition, the temperature of the nozzle was maintained at approximately 110° C. by circulation of the oil in the channels 14a and 14b of the latter (FIG. 2).

Taking into account the profile given to the jet ducts 3, 4 and 5 of nozzle 2, and in particular the fact that they converge with their lateral wall toward a common line l, the gaseous streams which issue from these mouthpieces, $SnCl_4$-stream from jet duct 5, and $H_2O$-vapour from jet ducts 3 and 4, which are laminar, enter into mutual contact firstly by touching each other tangentially then more and more directly as the line "l" is approached. Of course, the combined flow of these three gaseous streams becomes less and less laminar in the measure as these three streams interpenetrate. However, the latter takes place in fact only in the immediate proximity of the surface of the glass V, which, as stated, is heated to about 600° C., so that the combining reaction

$$SnCl_4 + 2H_2O \rightarrow SnO_2 + 4HCl \nearrow$$

occurs on the glass. It is opportune to remark at this point that, if no particular measures were taken, this reaction would occur in a very violent manner with production of a very large quantity of stannic oxide $SnO_2$ and of hydrates of the type $SnO_2.nH_2O$ at the outlet of the jet ducts 3 to 5 of nozzle 2, with the risk of partial or total clogging of the jet ducts, and a deposition of these same oxides on the glass in the form of a white precipitate and not in the form of the desired transparent semiconductor layer.

With the above-described installation, this risk was eliminated by adding a reducing agent to the gaseous streams of $SnCl_4$ and $H_2O$-vapour in the form of $H_2$, incorporated into the carrier gas. Hydrogen does in fact not react with either $SnCl_4$ or $H_2O$. Moreover, it acts as a catalyst. It can therefore be used as an inert carrier gas.

The combining reaction of SnCl$_4$ and H$_2$O occurs not only in the central region of the nozzle 2, that is to say in proximity to that part of this nozzle into which open the jet ducts 3, 4 and 5. In fact, this reaction takes place when the pump 19 operates in such a manner, that, by the channels 16 and 17 disposed to either side of the nozzle, there is formed an underpressure at the right-hand and left-hand extremities, in the drawing of the space comprised between the glass plate V and the lower face of sections 6a and 6b of the nozzle. Owing to this, there is formed in this space a gas flow moving from the central portion of this space towards the channels 16 and 17 already mentioned. This stream contains above all a portion of the SnCl$_4$ and H$_2$O dispersed in the carrier gas and as yet unreacted, the already formed HCl-vapours, and a certain quantity of carrier gas free from the reactants which have already reacted. Thus, the reaction between SnO$_2$ and H$_2$O can continue with the residual reactant gases over a certain length, to either side of the line "l" of convergence of the jet ducts.

The power of the suction realized with the channels 16 and 17 is selected in such a manner that the reactive gases issuing from the nozzle 2 do not reside in this space longer than the time strictly necessary for obtaining a deposit of SnO$_2$ on the glass, which deposit appears in the form of a transparent layer and not in the form of an accumulation of powdery SnO$_2$. Of course, the suction must not be too strong, because otherwise the reactive gases issuing from the nozzle would not have the time to reach the surface of the glass. The intensity of the suction is therefore of critical importance with regard to the quality and the rate of growth of the layer. It will be noted in addition that, by means of this suction, in a manner of speaking the space comprised between the nozzle and the glass plate, in which space the desired reaction takes place, is insulated from the ambient atmosphere, preventing, on the one hand, any possible penetration into this space of additional moisture capable of influencing the combination reaction whilst preventing, on the other hand, any leakage to this same ambient atmosphere of noxious vapours, for example HCl or hydrogen, the ambient air tending to flow towards the slots 16a and 16b, 17a, 17b, respectively, passing between the channels 16 and 17 respectively, the glass plate V and the nozzle 2.

The gaseous products drawn off by pump 19 are directed, as stated, to the scrubbing tower 20, so that the residual volatile acids percolate and are entrained by the water, the resulting acid solution being separated from the scrubbed gases and evacuated through the conduit 20a.

With the operating conditions described above, the reaction yield has about 70%. The glass was coated over the whole of its surface with a SnO$_2$-layer, having a thickness of 500 nm, a transparency of 90 to 95% according to sample and a mean conductivity R$_\square$=200Ω.

Moreover, the SnO$_2$-layer thus obtained was found to be of a particularly high hardness, greater than that of the glass on which it has been deposited. Accordingly, it had a great resistance, be it to the most intense mechanical stresses, for example to impact, or to acids. In particular, this glass could be subjected to a bending operation with a radius of curvature of 15 cm, after being heated to a temperature between 600° and 700° C., without any deterioration in the SnO$_2$-coating. It was also possible to temper it under the usual conditions applying to conventional glass. Lastly, it is to be noted that a glass plate coated with a SnO$_2$-layer in the conditions and by the method described, can be cut with diamond on either face without splintering of the coating.

With this same installation, and operating conditions differing from those indicated only in the velocity of advance of the plate V, this velocity having been raised to approximately 10 m/min, there was obtained an SnO$_2$ deposit having a thickness of approximately 10 nm, a mean conductivity R$_\square$=1.5 KΩ, a transparency of almost 100% for visible radiation and mechanical properties practically equivalent to those of the layer obtained by advancing the glass plate at a speed of 2 m/min.

The installation described in the foregoing can also be employed to deposit, by C.V.D., a layer of TiO$_2$ on a glass plate. To this end, it suffices to replace in the bubble tank 21 the stannic chloride SnCl$_4$ with titanium tetrachloride TiCl$_4$. It would also be possible to employ a carrier gas constituted solely by nitrogen.

The reaction which will take place at the outlet of nozzle 2 will be as follows:

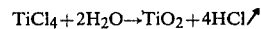
$$TiCl_4 + 2H_2O \rightarrow TiO_2 + 4HCl \nearrow$$

A glass plate of 20 cm width and 4 mm thickness, heated to a temperature of 600° C., was displaced longitudinally at a rate of 2 m/min in front of a nozzle 2, at a distance of 6 mm from the latter. By operating the valves 23a and 24a, the flow rate of the carrier gas was adjusted to 60 l/h for the flowmeter 23 and to 120 l/h for the flowmeter 24. In addition, the vessels 21 and 22 were heated to achieve reactant flow rates of 0.2 mole/h TiCl$_4$ and 0.01 mole/h H$_2$O.

There was obtained a TiO$_2$ layer of 0.01 μm thickness, having a transparency of about 75% to visible light and a reflecting power for this same visible light of the order of 50%, that is to say, greater than the glass bearing the deposit. The mechanical strength was comparable to that of a SnO$_2$-layer obtained in the manner described.

The direct addition of H$_2$, in order to attenuate the violence of the combination reaction between SnCl$_4$ and H$_2$O-vapour, is not the only possible measure. According to a modified mode of execution of the process according to the invention, it is possible to make use of a carrier gas constituted exclusively by nitrogen and to produce in situ the hydrogen necessary for the reduction, from methanol, CH$_3$OH. FIG. 1a shows how the installation already described (FIG. 1) is to be modified in this case.

As shown, the new installation must comprise and additional bubble tank 31, containing the methanol, a flowmeter 32 with its flow-control valve 32a, a valve 33 located on a pipe 34 connecting the flowmeter 32 to the vessel 31 and lastly a conduit 35, connecting the outlet of this vessel to the conduit 30 and thus, to the ducts 11 and 12 of nozzle 2, and thereby to the outer jet ducts 3 and 4 of the latter.

The conduits 29, 30 and 35 pass through an enclosure E$_2$, indicated schematically by a contour drawn in composite lines, containing a heating liquid, for example oil, kept at a constant temperature of about 110° C. in any suitable manner.

When brought into the presence of SnCl$_4$, the methanol can react with the latter in the following manner:

$$SnCl_4 + 2CH_3OH \rightarrow SnO_2 + 2HCl + 2CH_3Cl$$

Furthermore, taking into account the relatively high temperature prevailing at the outlet of the jet ducts, the methanol can decompose according to the reaction $$CH_3OH \rightarrow 2H_2 + CO$$

It can also react with H$_2$O according to the reaction:

$$CH_3OH + H_2O \rightarrow 3H_2 + CO_2$$

In either case, there is thus ensured the in situ production of the hydrogen necessary for controlling the already mentioned essential reaction:

$$SnCl_4 + 2H_2O \rightarrow SnO_2 + 4HCl \nearrow$$

It is opportune to remark that the experiments have not permitted to determine which of the three above reactions of CH$_3$OH had procedence. It has nevertheless been noted that, in the operating conditions described in the following, the introduction of methanol into the process of depositing the desired SnO$_2$ layer effectively made it possible to control this process in the same manner as in the case where the hydrogen was mixed to the nitrogen as carrier gas (FIG. 1).

To obtain, with the pilot installation already described and modified by the addition of the elements required by this mode of execution, a glass plate of 20 cm width and covered with a transparent SnO$_2$-layer, through each of the three vessels 21, 22 and 31 a flow of about 60 l/h nitrogen is passed, all flow rates being controlled by operation of the valves 23a, 24a and 32a with which are equipped the flowmeters 23, 24 and 32. These vessels were heated to suitable temperatures to effect that their flow rates of the corresponding reactant are respectively 1 mole/h of SnCl$_4$, 1 mole/h H$_2$O and 0.5 mole/h CH$_3$OH. As previously, the temperature of the nozzle, maintained by oil circulation, was 110° C., whilst the glass plate was preheated to a temperature of about 600° C. The glass was driven in the direction F at a velocity of 2 m/min. keeping it at a distance of 6 mm from the lower face of sections 6a and 6b constituting the nozzle.

The SnO$_2$-coating obtained was found to be practically identical in thickness, quality and mechanical, electrical or physical properties to the similar coating obtained with the aid of the installation illustrated with reference to FIG. 1.

Figure 1B:
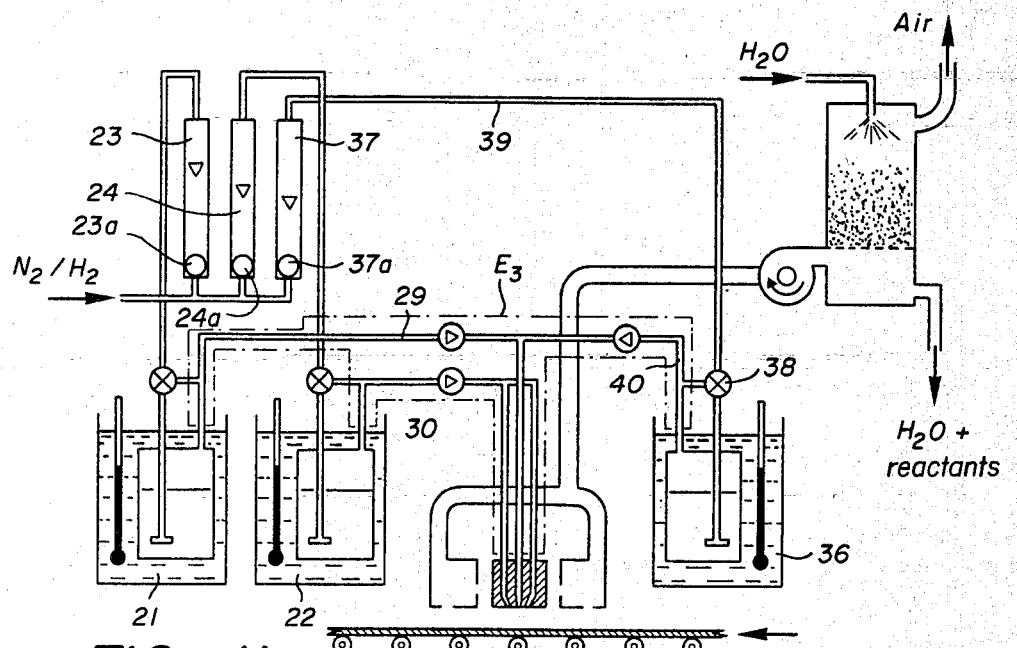

The variant of the installation which is the subject of FIG. 1b is more particularly designed for producing antimony-doped SnO$_2$-layers, by replacing certain tin atoms with Sb. It is known in fact that by means of such doping, it is possible in particular to obtain a relatively substantial reduction of the resistivity of the layer.

Such doping can be obtained by carrying out the following reaction:

$$2SbCl_5 + 5H_2O \rightarrow 2Sb_2O_5 + HCl$$

which makes it possible accessorily to introduce antimony ions into the crystal structure of SnO$_2$.

Since the antimony chloride reacts with water but not with stannic chloride, the installation according to FIG. 1b is embodied in such a manner that the SbCl$_5$ only comes into contact with H$_2$O at the outlet of nozzle 2, whilst being mixed with stannic chloride, SnCl$_4$. Thus the above reaction takes place simultaneously with that of the combination of SnCl$_4$ and H$_2$O-vapour.

The new installation differs from that of FIG. 1 by the addition of a bubble tank 36, containing the liquid antimony chloride SbCl$_5$, a flowmeter 37 with control valve 37a, and lastly a conduit 40 connecting the outlet of this vessel to conduit 29, and thus to the central jet-duct 5 of the nozzle through the duct 13 of the latter (FIG. 2); also, a pipe 39 carries a valve 38.

The conduits 29, 30 and 40 pass through an enclosure E$_3$, illustrated schematically by a contour drawn in composite lines, containing a heating liquid, for example oil, maintained at a constant temperature of about 110° C. in any suitable manner.

A pilot installation of this type, fitted with a nozzle having the same features as those of the nozzle of the pilot installation already described, mounted in accordance with the diagram of FIG. 1, made it possible to coat a glass plate of 20 cm width and 4 mm thickness with a deposit of antimony-doped SnO$_2$ of 500 nm thickness. Essentially, the operating conditions were as follows:

The glass was heated to a temperature of 600° C. approximately and was displaced longitudinally at a distance of 6 mm from the nozzle with a velocity of 2 m/min. The carrier gas used was a mixture of nitrogen and hydrogen N$_2$ 40% H$_2$ and the flow rates of this gas were adjusted, by operating the valves 23a, 24a and 33a, to the following values: 60 l/h for the vessel 21 containing the liquid SnCl$_4$, 60 l/h for the vessel 22 containing H$_2$O and 20 l/h for the vessel 36, containing the liquid SbCl$_5$. Moreover, the vessels were heated so as to obtain reactant flow rates, respectively, of 2 mole/h SnCl$_4$, 2 mole/h H$_2$O and 0.1 mole/h SbCl$_5$.

There was obtained a doped SnO$_2$ layer having a resistivity R$_\square$ of the order of 70Ω and a transparency of 60%. The other properties, such as mechanical strength, impact resistance, tear resistance, acid resistance and suitability for thermal treatment such as tempering of the coated glass were equivalent to those of the undoped SnO$_2$-layers deposited in the manner already described. Its reflecting power was practically the same as that of the glass on which the layer has been deposited.

With this same installation and under operating conditions differing from those indicated above only with regard to the speed of advance of the plate V, which velocity was raised to about 10 m/min, there was obtained a deposit of antimony-doped SnO$_2$ having a thickness of approximately 10 nm, a mean conductivity R$_\square$=500Ω, a transparency of 80% in the visible spectrum and mechanical properties identical to those obtained with the similarly antimony-doped SnO$_2$ deposit covering a glass plate displaced at a speed of 2 m/min.

Although the installation illustrated in FIG. 1b employs, by way of reducing agent, hydrogen introduced into the carrier gas, namely nitrogen, it is obvious that it would be equally possible to conceive a similar installation in which the reducing agent would be obtained from methanol, CH$_3$OH, as in the case of the form of embodiment shown in FIG. 1a. Thus, the new installation would be a combination of the installations in FIGS. 1a and 1b, because it would comprise, in addition to the vessels 21 and 22 containing the SnCl$_4$ and water, respectively, vessels 31 and 36 containing, respectively, the CH₃OH and the SbCl₅. These vessels would be connected to the nozzle 2 in the same manner as in the assemblies of FIGS. 1, 1a and 1b. On this assumption, the above vessels would be fed with nitrogen at flow rates of 60 l/h, with the exception of the vessel for $SbCl_5$ which would receive only 20 l/h. The heating temperatures of the vessels would be such that the following reactant feed rates to the nozzle 2 would obtain: 1 mole/h for $SnCl_4$, 1 mole/h for $H_2O$, 2 mole/h for $CH_3OH$ and 0.1 mole/h for the $SbCl_5$.

The resistivity, the reflecting power and the transparency of the $SnO_2$-layers on the glass can be improved to a very great extent if these layers are fluorine-doped layerrs. To this effect, preferably the installation described with reference to FIG. 1 will be used, augmented by a cylinder 41 containing gaseous HF, and by a conduit 42 connecting this cylinder to the conduit 30, the whole being shown in broken lines in the drawing.

A glass of 4 mm thickness, heated to a temperature of about 600° C., was coated with a 900 nm thick layer of $SnO_2$, doped with fluorine by passing in front of the nozzle at a velocity of 2 m/min and at a distance of 6 mm therefrom. The flow rates of the carrier gas (a mixture of $N_2$ 40% $H_2$) were of 60 l/h for the $SbCl_4$ and the water vapour. The flow rate of HF was 0.1 l/min. The flourine-doped $SnO_2$ coating was found to have particularly high performance. In fact, its resistivity was $R_\square = 20\Omega$, its reflecting power in visible light greater than that of the supporting glass, and its infrared reflecting power was found to be particularly high, of the order of 75%. Moreover, its transparency to visible light was 90%. Its mechanical strength properties were also very pronounced: the glass coated with fluorine-doped $SnO_2$ was able to undergo a thermal treatment of tempering identical to those to which are traditionally subjected certain vehicle windows, for example the side windows of automobile vehicles. It was also possible to bend such a plate when hot (temperature approximately 650° C.) with curvature radii of 15 cm without modifying the properties of the doped $SnO_2$ coating. Moreover, a glass plate coated in the described manner could be worked in the traditional fashion (cutting, grinding, etc, . . . ) without damage to the coating. The layer of $SnO_2$ doped with F had in fact a hardness greater than that of the supporting glass and could not be scratched, while its chemical resistance to acids and its impact resistance were found to be particularly high.

It is to be remarked further that a layer of $SnO_2$ doped with flourine or antimony deposited on a plate of glass in the conditions stated can be coated with silver or a silver paint deposited at 600° C., for example in order to form electrical contacts. Such a silver coating adheres very well to the surface of the $SnO_2$ layer.

With this same installation (FIG. 1b) and under operating conditions differing from those indicated above only with respect to the speed of advance of the plate V, this speed having been raised to approximately 10 m/min, there was obtained a fluorine-doped $SnO_2$ deposit having a thickness of about 10 nm, a mean conductivity of $R_\square \approx 200\Omega$, a transparency of almost 100% in the visible spectrum, an infrared-reflecting power of 25% and mechanical properties identical to those obtained with the $SnO_2$-deposit also doped with fluorine by displacement of the glass plate at a velocity of 2 m/min.

Although the installation shown in FIG. 1, augmented by a cylinder 41 containing gaseous HF and by a conduit 42 connecting this cylinder to the conduit 30, uses by way of reducing agent hydrogen introduced into the carrier gas (nitrogen), it is obvious that it would be equally possible to conceive an installation making it possible to obtain fluorine-doped $SnO_2$ layers in which the reducing agent would be obtained from methanol, $CH_3OH$, as in the case of the form of embodiment of the installation illustrated in FIG. 1a. This new installation would thus be a combination of the installations of FIGS. 1 and 1a: it would appear in practice as the installation of FIG. 1a with addition of the HF-cylinder 41, connected to the conduit 30 by the conduit 42, all these being elements already described previously with reference to the installation in FIG. 1 and illustrated in broken lines in this figure.

On these assumptions, the vessels 21, 22 and 31 would be fed with nitrogen at flow rates of 60 l/h, the flow rate of HF being 0.1 l/h. They would be heated to such temperatures that the flow rates of the reactants transported toward the nozzle 2 would be of 1 mole/h for $SnCl_4$, 1 mole/h for $H_2O$ and 2 mole/h for $CH_3OH$.

In the conditions stated above, a glass of 4 mm thickness, heated to a temperature of about 600° C., was coated with a layer of 600 nm of fluorine-doped $SnO_2$ by passing in front of the nozzle 2 which was maintained at a temperature of approximately 110° C. in the previously described manner, at a speed of 2 m/min and at a distance of about 6 mm from this nozzle.

The $SnO_2$ deposit thus obtained had a resistivity of about $R_\square = 40\Omega$. The other features of physical, optical or mechanical nature remained comparable to the fluorine-doped $SnO_2$ coating obtained by direct introduction of the hydrogen into the carrier gas (installation in accordance with FIG. 1, augmented by cylinder 41).

The uses of glass plates of all dimensions coated with a layer of undoped $SnO_2$ or doped with antimony or fluorine can be of the most diverse kind, depending on their physical and electrical properties in particular.

Although an undoped layer of $SnO_2$ has a relatively high resistivity when compared with the resistivity of a similar layer doped with antimony or fluorine, a glass panel covered with such a layer can be used for example to constitute windows or window-casing for dwellings, ships or trains, in view of its good transparency to visible light and its relatively high infrared-reflecting power. In fact, such a plate has a sufficient athermic capacity to reduce substantially the thermal sunrays likely to pass through this panel.

This athermic capacity is obviously greater when a glass coated with antimony-doped $SnO_2$ or a glass coated with fluorine-doped $SnO_2$ is concerned. Moreover, the resistivity of such layers being rather low in the case of antimony-doped $SnO_2$ and very low in the case of fluorine-doped $SnO_2$, it is possible to employ glasses coated with doped $SnO_2$ as heating windows, for example as rear windows of cars.

It has moreover been observed that, when placed in a very humid atmosphere, a glass panel carrying a coating of $SnO_2$, doped with antimony or fluorine or not, does not cover itself with a uniform layer of mist but rather with a multiplicity of droplets, thus affecting to a much lesser extent the visibility through the coating proper and the glass panel.

This property is obviously very advantageous in the case of glass panels designed to form windows, notably car windows and especially windscreens and rear windows of cars, buses or vans.

Although in the preceding description reference was made to the forms of embodiment of installations in which the glass plates to be coated with a layer of SnO$_2$, doped or not, are employs placed at a distance from the nozzle corresponding to the distance separating this nozzle and the edge of convergence of the lateral walls of the three jet ducts of this nozzle, it will be noted that, in practice, it will be possible to reduce slightly this distance in order to effect that the mixing of the reactants issuing from these blastpipes takes place on impact on the glass, producing a relatively intense local turbulence which promotes this mixing.

Lastly, it will be noted that, although mentioned within the scope of the process and of the installations described with reference to FIGS. 1, 1a, 1b and 2, of the attached drawings, the use of hydrogen as a means for controlling the combination reaction of SnCl$_4$ and H$_2$O could also take place, for the same purposes and with the same benefits, if such a reaction were obtained by employing processes and installations of different nature functioning in accordance with the C.V.D. method, such as those described by H. Koch in the previously cited paper or in the German patent application No. 2 123 274 published prior to examination.

We claim:

1. Apparatus for continuously depositing on the surface of a heated substrate a layer of solid material formed from the reaction of at least two reactants selected from gaseous reactants and reactants diluted in inert carrier gas, which apparatus comprises: a source of a first gaseous reactant or reactant diluted in a carrier gas, a source of a second gaseous reactant or reactant diluted in a carrier gas, a nozzle with three jet ducts each having an exhaust aperture constituted by a rectilinear slot and having lateral walls delimiting the longitudinal edges of each slot which walls converge towards a line common to all said jet ducts, a first of said jet ducts adjoining, with a first longitudinal edge of its exhaust aperture, a longitudinal exhaust aperture edge of a second said jet duct and, with the second longitudinal edge of its said aperture, a longitudinal edge of the exhaust aperture of the third jet duct, first and second deflecting surfaces, respectively extending over a predetermined length to each side of said jet ducts from the said second longitudinal edge of the exhaust aperture of the second and third jet duct respectively, said deflecting surfaces being coplanar with each other and with the said longitudinal edges of the exhaust apertures of the jet ducts of the nozzle and being kinematically integral with this nozzle, a first distributor network connecting the source of the first reactant with the first jet duct of the nozzle, a second distributor network connecting the source of the second reactant with the second and third jet ducts of the nozzle, means for effecting relative movement of the substrate and the nozzle in a direction substantially perpendicular to said imaginary common line, means for maintaining constant in the course of said relative movement the distance separating the plane containing said exhaust apertures and said deflecting surfaces from the said surface of the substrate, and maintaining this distance substantially equal to that between the jet ducts of the nozzle and the said imaginary line, and at least one device for evacuating the reaction gases evolving in the space between the said deflecting surfaces and the surface of the substrate, from the extremities of this space most remote from the said apertures of said nozzle.

2. Apparatus according to claim 1, in which the width of each of the slots constituting the exhaust apertures of the jet ducts of the nozzle is not less than 1/10 mm and not greater than 2/10 mm.

3. Apparatus according to claim 1, characterised in that the first and second deflecting surfaces are covered with a layer selected from chemically inert metals and alloys of such metal.

4. Apparatus according to claim 1, characterised in that the first and second deflecting surfaces are covered with a layer of a chemically inert metal oxide.

5. Apparatus according to claim 2, characterised in that the first and second deflecting surfaces extend, to each side of the jet ducts of the nozzle, over a length which is 10 to 20 times greater than the width of the slots constituting the exhaust apertures of the jet ducts.

6. Apparatus according to claim 5, characterised in that the distance separating the said deflecting surfaces and the surface of the substrate is between 3 and 6 mm.

* * * * *